United States Patent [19]

Marquardt et al.

[11] Patent Number: 4,682,278
[45] Date of Patent: Jul. 21, 1987

[54] PROCEDURE AND DEVICE FOR DETECTING THE NON-CONDUCTING STATE OF TURN-OFF THYRISTORS

[75] Inventors: Rainer Marquardt; Theodor Salzmann, both of Erlangen; Michael Peppel, Koenigstein, all of Fed. Rep. of Germany

[73] Assignee: Siemens Aktiengesellschaft, Berlin and Munich, Fed. Rep. of Germany

[21] Appl. No.: 775,471

[22] Filed: Sep. 12, 1985

[30] Foreign Application Priority Data

Sep. 18, 1984 [DE] Fed. Rep. of Germany ....... 3434607

[51] Int. Cl.$^4$ ............................................ H02H 7/122
[52] U.S. Cl. ........................................ 363/58; 363/56
[58] Field of Search ............... 307/252 C; 363/56, 57, 363/58, 68

[56] References Cited

U.S. PATENT DOCUMENTS

| 4,084,206 | 4/1978 | Leowald et al. | 363/57 |
| 4,231,083 | 10/1980 | Matsuda et al. | 363/57 |
| 4,597,038 | 6/1986 | Stacey | 363/56 |

FOREIGN PATENT DOCUMENTS 59-17861  1/1984  Japan .

OTHER PUBLICATIONS

Bosterling et al., "Praxis Mit Dem GTO", Elektrotechnik Issue 24, 1982, pp. 16–21.
Bosterling et al., "Praxis Mit Dem GTO", Elektrotechnik Issue 4, 1983, pp. 14–17.

Primary Examiner—Patrick R. Salce
Assistant Examiner—Jeffrey Sterrett
Attorney, Agent, or Firm—Jeffrey P. Morris

[57] ABSTRACT

This invention concerns a procedure to operate a turn-off thyristor which can be set to a current-conducting state or a current-blocking state as a function of a switch-on command or a switch-off command. To permit particularly reliable and optimal operation of the turn-off thyristor, the voltage between its gate terminal, G, and its cathode terminal, K, is detected and when it drops below a negative threshold current value $U_{GKS}$, a status signal, Z, is generated which indicates the current-blocking state of the turn-off thyristor. A further embodiment detects the gate current of the turn-off thyristor and after the appearance of the switch-off command, the status signal is generated as the polarity changes in accordance with the time derivative of the gate current. An overload of the turn-off thyristor is best recognized by having simultaneous to the appearance of the switch-off command, a time function with a preset expiration time initiated, and having a malfunction notification signal, F, generated for protective ignition of the turn-off thyristor if the time function expires prior to the appearance of the status signal.

58 Claims, 9 Drawing Figures

PROCEDURE AND DEVICE FOR DETECTING THE NON-CONDUCTING STATE OF TURN-OFF THYRISTORS

FIELD OF THE INVENTION

The invention relates to a procedure to operate a turn-off thyristor (GTO thyristor) which can be controlled as a function of a switch-on command or a switch-off command in a power-conducting or a power-blocking state, and a device to execute the procedure.

BACKGROUND OF THE INVENTION

A device to operate a turn-off thryistor is described in the periodical "Elektrotechnik", issue 4, 1983, at pages 14 through 17, and FIG. 12, where a converter is shown connected in a bridge circuit. A control source is connected to the turn-off thyristor which is connected on its output side to the gate connection and to the cathode connection of the turn-off thyristor. The control source controls the thyristor as a function of a switch-off command or a switch-on command when in a power-conducting or power-blocking state respectively. The block diagram of the control source is also shown in the periodical "Elektrotechnik", issue 24, 1982, pages 16 through 21 in FIG. 7. To assure reliable operation of the turn-off thyristor, current and voltage at the turn-off thyristor have to remain within preset limits. For that purpose, in the known apparatus the design incorporates a capacitor parallel to the turn-off thyristor, a resistance and two diodes; moreover, wired in series with the turn-off thyristor there is an inductor and a current sensor device which detects the current through the turn-off thyristor which in case of excess current issues a switch-off command to the control source.

In the existing device it is necessary for the above-described circuitry to be designed to limit the current and voltage at the turn-off thyristor to the worst case operating condition of the turn-off thyristor in the converter in order to be able to continually assure safe operation of the turn-off thyristor; however, these circuitry parameters contradict the requirement for rapid switch-on and switch-off of the current by the turn-off thyristor. Thus, for example, the inductor connected in series with the turn-off thyristor is rated so that it limits the current rise through the turn-off thyristor in case of excess current by making possible a switch-off of the turn-off thyristor by means of the current sensor device before the current attains a maximum permissible conducting state current value that can be switched off by the turn-off thyristor. This arrangement with the inductor involves a relatively major additional circuitry expense and, moreover, results in additional power losses and voltage drops.

In order to avoid a short circuit in the converter after issuing a turn-off command to the control source controlling the turn-off thyristor, a triggering of the additional turn-off thyristor in the same bridge circuit into a conductive state is only possible once the turn-off thyristor has totally shut off the current. It is thus required for reliable operation of the turn-off thyristor as a function of the circuitry at the turn-off thyristor and its delayed reaction, to specify an adequately calculated interlock time for the worst case operating situation upon the issuance of the turn-off command, during which time any triggering of the additional turn-off thyristor into a conductive state is inhibited. Observing this interlock time, however, produces unfavorable operating characteristics of the converter.

The object of this invention is thus to develop a procedure and device that provides both particularly reliable and optimal operation of the turn-off thyristor in terms both of its utilization and of its reliability protection.

SUMMARY OF THE INVENTION

To achieve this task in accordance with this invention, the voltage between the gate connection and the cathode connection of the turn-off thyristor is detected and compared to a negative threshold voltage value; when falling below the negative threshold voltage value, a status signal is generated which indicates the transition of the turn-off thyristor into a current-blocking state.

A further solution to this task is provided by this invention by detecting the gate current flowing in the gate connection of the turn-off thyristor and generating an auxiliary signal after the turn-off command appears, which corresponds to the time variance of the gate current; when changing the polarity of the auxiliary signal, a status signal is generated which indicates the transition of the turn-off thyristor into the current-blocking status.

In both precedures in accordance with the invention there is a preferred functional supervision of the turn-off thyristor since based on the voltage pattern between the gate connection and the cathode connection or based upon the pattern of the gate current, the instantaneous state of the turn-off thyristor is derived and utilized to generate a status signal. In this context the time duration from the appearance of the logic signal until the generation of the status signal corresponds approximately to the storage time of the turn-off thyristor, which represents a turn-off delay time dependent upon the temperature, the triggering requirements and the turnoff thyristors conducting state current. After the storage time expires, i.e. approximately at the time that the status signal appears, the current is switched off by the turn-off thyristor and the turn-off thyristor is thus in a current-blocking state. Due to the issuing of the status signal, malfunctions can be rapidly recognized and protective measures for the turn-off thyristor or of a device in which the turn-off thyristor is installed can be initiated. Furthermore, by issuing a status signal, an adaptive regulation of the turn-off thyristor or of the device or circuitry of the latter is made possible as a function of the instantaneous state of the thyristor so that the regulation can proceed from the perspective of attaining optimal operation of the turn-off thyristor or device without observing any possible fixed or unnecessarily long interlock period.

Another embodiment of the invention preferably consists in having the gate current flowing in the gate connection of the turn-off thyristor detected so that after the issuance of a switch-off signal an auxiliary signal is generated corresponding to the time variance of the gate current, such that the detected gate current is monitored in the event it falls below a negative threshold current value and that a status signal is generated indicating the transition of the turn-off thyristor into the current-blocking state if the auxiliary signal changes its polarity and the negative threshold current value is not attained, or that the status signal is generated if within a preset time duration following the issuance of the switch-off, the negative threshold current value has been attained. In this fashion it is assured that the status signal is generated even if the turn-off thyristor at the time of its switch-off is operating at no load, or if a very small current was switched off by the turn-off thyristor so that the turnoff thyristor assumed its current-blocking state already at a very slight negative gate current falling below the negative threshold current value. In said instance the status signal will be generated after the expiration of a preset time from the issuance of the switch-off command. Moreover, this arrangement prevents any erroneous detection of the gate current leading to the issuance of a status signal at the start of the negative gate current approximately from the time when the logic signal appears until the gate current falls below the negative threshold current value.

It is particularly advantageous if simultaneously with the issuance of the logic OFF signal a time function with a preset period is initiated and a malfunction notification signal generated once the time period has expired prior to the issuance of the status signal. Thus monitoring of the turn-off thyristor in reference to a possible overload is attained in a particularly simple fashion in that the physical characteristic of the turn-off thyristor that its storage time increases as its conductive state current and blocking layer (junction) temperature increase, is utilized to generate a malfunction notification signal as soon as the storage time exceeds a maximum value corresponding to the preset expiration period. In this context the malfunction notification signal attains a particular significance for indicating excess current flowing to the turn-off thyristor since, as already explained above, there is a maximum conductive state current value which can be switched off for the turn-off thyristor, above which any effort to turn off the unit can destroy the turn-off thyristor. The preset expiration period is thus selected so that it is shorter than the storage time of the thyristor in case of excess current; an unacceptable switch-off attempt is recognized as if the preset expiration period were exceeded, and the attempt is discontinued by having the turn-off thyristor regulated into a current-conductive state by a protective ignition triggered upon issuance of the malfunction notification signal. In contrast to the known devices described in the background, in the procedure according to this invention, for the monitoring of the turn-off thyristor excess current, no additional current sensor device and no additional inductor restricting the current increase is required. Moreover, in this embodiment of the procedure according to the invention, actuation of the excess current monitoring in the event of short duration, peak currents during the conductive state of the turn-off thyristor is prevented because said peak currents should have permissible values which are greater than the maximum conductive state current value which can be turned off.

Monitoring the turn-off thyristor in terms of possible overload can be advantageously expanded by deriving an integration variable from the detected gate current from the time that the switch-off command signal is issued until the status signal is generated, which corresponds to the time integral of the gate current, and by having an overload signal generated if the integration variable exceeds a preset threshold value before the status signal is generated. Therein the integration variable corresponds, during a fault-free switch-off cycle at the time of the issuance of the status signal, to the turn-off load of the turn-off thyristor. If the conductive state current to be turned off passing through the turn-off thyristor exceeds the maximum permissible conductive state current value which can be turned off, then the turn-off load exceeds the preset threshold value whereupon the overload signal is generated. In this case also the switch-off attempt is discontinued upon occurrence of the overload signal preferably by a protective ignition of the turn-off thyristor into a power-conductive state.

As the turn-off load of the turn-off thyristor in comparison to its storage time on the one hand has a substantially lesser functional dependency on the triggering parameters and conductive state current of the turn-off thyristor and on the other hand is more temperature-dependent, the possibility exists in the event of a malfunction to determine after the fact, based upon the malfunction signal and the overload notification signal, whether the overload was due to inadequate triggering parameters, such as insufficient negative gate current, or due to an excessive blocking layer temperature of the turn-off thyristor.

As indicated above, the generation of the status signal permits an adaptive regulation of the turn-off thyristor or of the device in which it is contained. Particularly advantageous in this context is the application of the procedure in accordance with the invention in each of two turn-off thyristors, of which the first turn-off thyristor is located in one bridge circuit half and the second turn-off thyristor in the other bridge circuit half of a converter, in that the switch on command is passed to the first turn-off thyristor only if a status signal indicating the current-blocking state of the second turn-off thyristor prevails and a switch on command is conducted to the second turn-off thyristor only in the presence of a status signal indicating the current-blocking state of the first turn-off thyristor. Thereby a mutual, adaptive interlock of the turn-off thyristors in both bridge circuit halves of the converter is established, permitting the converter to operate without using a fixed preset interlock period reflecting the worst case operating condition. Instead, this mutual adaptive interlock allows the shortest possible interlock period reflecting the physical behavior of the turn-off thyristors, without, however, running the danger of a commutation short-circuit due to the conductive state of both turn-off thyristors.

In accordance with a different aspect of the invention, the objects are achieved by providing a device to operate a turn-off thyristor includes a threshold voltage comparator whose input is connected via a first input connection to the gate connection of the turn-off thyristor and via a second input connection to the cathode connection of the turn-off thyristor. It also has a status signal output to issue a status signal as soon as the voltage between the first and second input connection drops below a negative threshold voltage value. This device in accordance with the invention thereby generates, in accordance with one of the procedures of the invention, a status signal at its status signal output as soon as the voltage between the gate connection and the cathode connection of the turn-off thyristor drops below the negative threshold voltage value. As the turn-off thyristor for triggering generally is connected with its gate connection and its cathode connection to a control source via a control line, it is possible to connect the input of the threshold voltage comparator to the output of the control source in order thereby to incorporate the control source and the device specified in this invention in a common component. Thus, when triggering the turn-off thyristor, an adequate compensation of the inductive current drop along the control line is possible by properly setting the threshold voltage value in the threshold value comparator. A particularly precise voltage detection, however, is attained by the device in accordance with the invention by having the input of the threshold value comparator, if neccessary via a separate measurement line, connected directly to the gate connection and cathode connection of the turn-off thyristor.

Preferably, an embodiment of the device in accordance with this invention due to its low circuitry expenditure has a threshold voltage comparator which incorporates a differential amplifier which is connected as the zero voltage comparator and whose output is connected to the status signal output, and, in a series circuit connected between the input of the differential amplifier and the input of the threshold voltage comparator, incorporates a reference voltage element wired to generate the negative threshold voltage value. A breakdown diode can be used as the reference voltage element located in this series circuit and supplied from a power source to its connections.

In a further embodiment of a device to operate a turn-off thyristor having its gate connection and cathode connection connected to a turn-off power circuit, a current detecting device is included in accordance with this invention with its current-sensitive input in the turn-off power circuit; at the output of the current-detecting device a differential circuit is connected and a polarity detector is in series with the differential circuit, whose output is connected to a status signal output of the device to issue a status signal. Thereby, in accordance with a further procedure under this invention, the negative gate current, conducted to the gate connection of the turn-off thyristor in order to turn if off is detected by the current detection device; the differential circuit generates an auxiliary signal corresponding to the time change of the negative gate current. When said auxiliary signal changes its polarity, the polarity detector activates the status signal output of the device to issue the status signal.

The power-sensitive input of the current-detecting device can, for example, consist of a current-detecting resistance connected in series in the turn-off current circuit with a controllable switching device which is connected to a voltage detecting device to detect the current-proportional voltage drop at the current detecting resistance. Particularly preferably, however, is another embodiment of the device in accordance with the invention, wherein the controllable switching device is a field-effect transistor (FET) wherein the drain connection and the source connection of the field effect transistor form the current-sensitive innput of the current dtecting device to which a voltage detecting device is connected to detect the voltage drop at the field effect transistor, as thus any change of the circuitry of the logic current circuit, for example by including a current-detecting resistance, is not required. Thereby the nearly resistive behavior of the field effect transistor when through-connected is utilized in a preferred fashion, because the voltage drop at the field effect transistor, which has been driven into a current-conducting state in order to shut off the turn-off thyristor, is proportional to the negative gate current.

A yet further embodiment of the device in accordance with the invention contains a threshold value comparator connected to the output of the current detecting device, a timing stage which, when supplied with the switch-off command, emits at one output a pulse signal with a preset time cycle, and a controllable memory device which is connected with its first control input to the output of the timing stage and with a second control input to the output of the threshold value comparator, with a third control input to the output of the polarity detector and at its output side is connected with the status signal output to issue a status signal, whereby the controllable memory device during triggering of its first control input can be switched to a second status by triggering the second control input following a first state in which the controllable memory unit issues the status signal when completing the triggering of its first control input. In the second status the controllable memory unit issues a status signal when triggering the third control input. Thereby a reliable detection of the transition of the turn-off transistor into a current-blocking state is attained in a preferred fashion in that the status signal indicating the current-blocking state is prevented until the negative gate current drops below the preset threshold current value. This is of particular significane if the negative gate current is detected via the voltage drop at the field effect transistor, because immediately following the switch-off command initiation by the transition of the field effect transistor from current-blocking into current-conducting state, errors can arise when detecting the negative gate current, which could lead to an erroneous issuance of the status signal. A further advantage of this embodiment of the invention is the fact that the status signal is generated in a substitute fashion if due to a very low negative gate current which does not fall below the threshold current value, the assumption can be made that the turn-off thyristor is in no-load condition or that only a very low current was switched off. In terms of the design of the controllable memory device several options may be chosen. A particularly simple circuitry design of the device in accordance with the invention is attained by having the controllable memory device preferably incorporate a delay flip-flop whose data input forms the first control input, whose clock input forms the second control input, and whose reset input forms the third control input. The timing stage, when activated by the turn-off command, issues a delay signal to a further output following a preset time delay function, and the additional output of the timing stage and the inverting output of the delay flip-flop are connected by an AND circuit to the status signal output.

To permit monitoring of the turn-off thyristor in terms of an overload in accordance with the invention, preferably an embodiment of the device in accordance with the invention includes an integrating device at the output of the current-detecting device which issues an interrupt input connected to the status signal output. The integrating device has a threshold value detector connected to it in series which on its output side is connected to an overload notification output of the device to issue an overload notification signal.

Yet another embodiment of the device in accordance with the invention contains a time cycle device to generate a time function with a start input triggered by the switch-off command with an interrupt input connected to the status signal output and with a malfunction notification output to issue a malfunction signal once the time cycle has lapsed. Thereby the arrangement permits monitoring the turn-off thyristor in terms of any overload in accordance with an embodiment of a procedure of the invention. If in order to generate a status signal analog circuit components are utilized, then it is advantageous for circuitry reasons if the time cycle device of the device in accordance with the invention includes a series circuit comprising a timing capacitor and a timing resistance connected to the start input if a controllable switching element is wired parallel to the timing capacitor, whose control input forms the interrupt input of the time cycle device if a comparator device with a first input connection is connected to the connection point between the timing resistance and the timing capacitor and with a second input connection connected to a reference voltage source. The output of the comparator device generates the malfunction notification output of the time cycle device permitting the uniform application of analog circuitry components.

In a particularly simple embodiment of the device according to the invention due to its use of digital circuitry components, the time cycle device incorporates a one shot whose trigger input forms a start input of the time cycle device; the output of the one shot is connected with the clock input of a delay flip-flop, whose data input forms the interrupt input and whose output forms the malfunction notification output of the time cycle device.

To trigger the turn-off thyristor into a conductive state, the turn-off thyristor is generally connected with its gate connection and its cathode connections to a switch on power circuit, wherein a positive gate current can be conducted to the gate connection over a controllable switch from a voltage connection with positive voltage potential. To provide a protective ignition of the turn-off thyristor in accordance with an embodiment of a procedure of the invention, the controllable switch can be connected to the malfunction notification output. It is particularly advantageous, however, if the gate connection of the turn-off thyristor is connected by an additional controllable switching device to a positive auxiliary voltage connection and the control input of said additional switching device is connected to the malfunction notification output. By having the positive auxiliary voltage connection triggered by a higher positive voltage potential than, for example, the voltage connection of the switch on power circuit, it is in case of protective ignition of the turn-off thyristor supplied with an ignition pulse of particularly large amplitude and steep rise time, thereby assuring a very rapid and reliable protective ignition. For that reason the additional controllable switching device would preferrably be an auxiliary thyristor.

A similarly reliable protective ignition of the turn-off thyristor in accordance with a procedure of the invention is best attained by having the overload notification output connected to the control input of the additional controllable switching device.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF A PREFERRED EMBODIMENT

Figure 1:
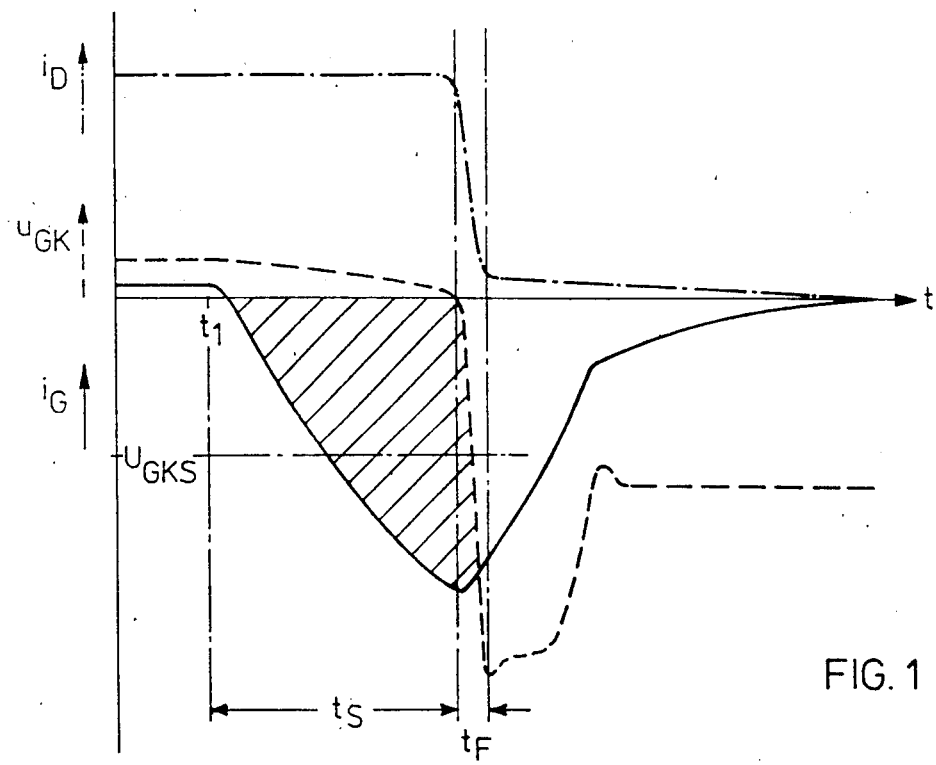
FIG. 1 is a graph of current and voltage characteristics at the turn-off thyristor.

The current and voltage patterns at a turn-off thyristor during a switch-off cycle will be discussed first. For that purpose the time characteristics of the conductive state current $i_D$ passing through the turn-off thyristor, the gate current $i_G$ in the gate connection of the turn-off thyristor, and the voltage $U_{GK}$ between the gate connection and the cathode connection of the turn-off thyristor during its switch-off are depicted in FIG. 1. Up to time $t_1$ the turn-off thyristor is in a conducting state so that a constant conductive state current $i_D$ flows through the unit; to reduce the conductive losses, voltage $U_{GK}$ and gate current $i_G$ each have a slight positive value. At time $t_1$; due to a logic command OFF by reversing the current direction of gate current $i_G$, a switch-off of the turn-off thyristor is initiated. After an approximate time duration of $t_S$, which corresponds to the storage time of the turn-off thyristor, gate current $i_G$ attains its minimal negative value and voltage $U_{GK}$ between the gate connection and the cathode connection drops down to a negative value. At the same time the conductive state current $i_D$ passing through the turn-off thyristor drops within a short drop time $t_F$ to a slight residual value. At the end of the fall time $t_F$ the turn-off thyristor is in its current-blocking state. In accordance with the procedure of this invention, the transition of the turn-off thyristor into the current-blocking state is recognized by the fact that the voltage $U_{GK}$ drops below a negative threshold voltage value $U_{GKS}$, or by the fact that the polarity of the time rate of change of the negative gate current $i_G$ reverses. While the gate current $i_G$ reverts from its minimum negative value to a zero value, the conductive current $i_D$ drops from the residual value to zero. The integral derived from the negative gate current $i_G$ from time point $t_1$ of the appearance of the logic command OFF until the end of the fall time $t_F$ corresponds to the switch-off load of the turn-off thyristor and is identified by the diagonally hatched area in the graph.

Figure 2:
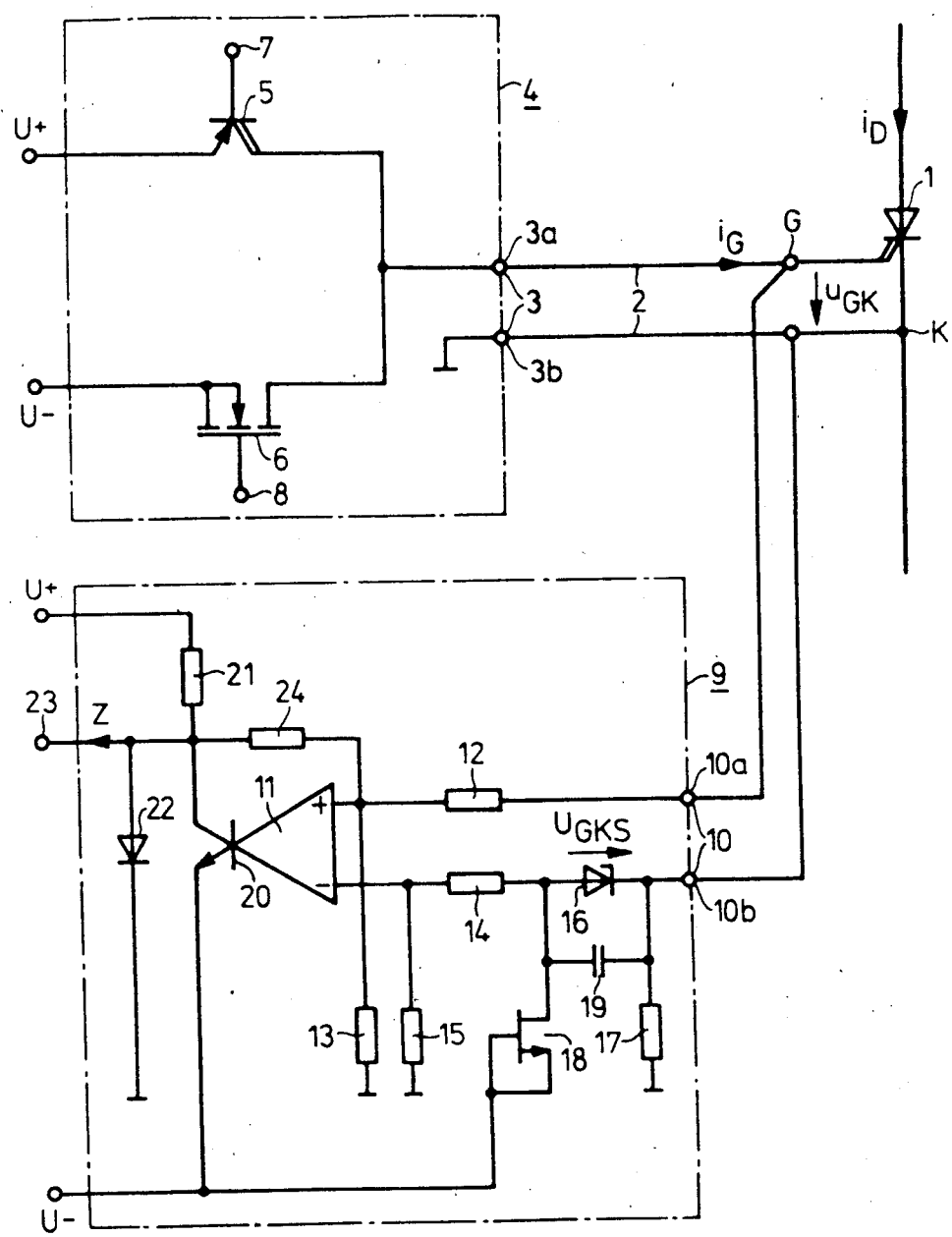
FIG. 2 is a schematic of a simple embodiment of the device in accordance with the invention.

FIG. 2 shows a block diagram of a simple embodiment of the device in accordance with the invention. The illustration shows a turn-off thyristor 1, through which a conductive current $i_D$ is flowing. The turn-off thyristor 1 is connected with its gate connection G and cathode connection K via a dual gate control line 2 to the output pair 3 of control source 4 which conducts a gate current $i_G$ to gate connection G in order to trigger turn-off thyristor 1. For that purpose control source 4 contains a first controllable switching device 5 consisting of a Darlington transistor, which connects terminal 3a of control output 3 which is in connection with gate terminal G of turn-off thyristor 1, to a voltage terminal U+ charged with positive voltage potential of a not further shown voltage supply device. A further controllable switching unit 6 consisting of an MOS field effect transistor is wired in a circuit located between a voltage terminal U of the voltage supply unit connected to a negative voltage potential and terminal 3a of control output 3. Terminal 3b of control output 3 connected to the cathode terminal K of turn-off thyristor 1 is connected to a chassis ground terminal, which in contrast to voltage terminals U+ and U— of the voltage supply device has zero potential. Both controllable switching devices 5 and 6 are triggered by a not further shown control device as a function of a logic command ON or logic command OFF in such a fashion that in the event of a logic command ON the first controllable switching device 5 is triggered to a conductive state so that a positive gate current $i_G$ flows to switch the turn-off thyristor 1 into a conductive state; in the event of a logic command OFF, the additional controllable switching device 6 is triggered into a conductive state so that a negative gate current $i_G$ flows to switch-off the turn-off thyristor 1 into a blocking state.

A threshold voltage comparator 9 is also connected to the turn-off thyristor 1, whose input 10 is connected by its own signal line S to the turn-off thyristor 1. A first input terminal 10a is connected to gate terminal G and a second input terminal 10b to the cathode terminal K of turn-off thyristor 1. The threshold voltage comparator 9 contains a differential amplifier 11, which is connected as a zero voltage comparator. In addition, the non-inverting input (+) of the differential amplifier 11 is connected over a first input resistance 12 to the first input terminal 10a of the threshold voltage comparator 9 and over a first compensation resistance 13 to a chassis ground terminal; the inverting input (—) of the differential amplifier 11 is connected over a further input resistance 14 to the second input terminal 10b of the threshold voltage comparator 9 and is similarly connected over another compensation resistance 15 to a chassis ground terminal.

Between the second input terminal 10b of the threshold voltage comparator 9 and the inverting input (—) of the differential amplifier 11 a reference voltage element 16 is wired in series with the additional input resistance 14, at which a voltage corresponding to the negative threshold voltage value $U_{GKS}$ exists. The reference voltage element 16 consists of a breakdown diode whose cathode terminal is connected for its own power supply via a power-limiting resistance 17 with the chassis ground terminal and whose anode connection is connected via an n-channel junction FET 18 wired as the power source to the negative voltage terminal U— of the voltage supply unit. A capacitor 19 is connected in parallel to the reference voltage element 16. Differential amplifier 11 is connected on its output side to the base terminal of a switching transistor 20 located with a collector resistance 21 in a common emitter circuit between the positive voltage terminal U+ and the negative voltage terminal U— of the not further shown voltage supply unit. Between the collector terminal of the switching transistor 20 and the chassis ground terminal, the circuit includes a clamping diode 22 in the flow direction shown. The collector terminal of the switching transistor 20 is connected to a status signal output 23 of the threshold value voltage comparator 9. By inserting a feedback resistance 24 between the collector terminal of the switching transistor 20 and the non-inverting input (+) of the differential amplifier 11 a switching hysteresis in the transmission characteristic function of the threshold voltage comparator 9 is generated.

As long as the first controllable switching unit 5 is set by a logic command ON into a power-conductive state, a positive gate current $i_G$ flows from the positive voltage terminal U+ of the voltage supply unit into the gate terminal G of the turn-off thyristor 1. Said thyristor is thus in a power-conductive state so that between gate terminal G and cathode terminal K there is a positive voltage $U_{GK}$. Between the non-inverting input (+) and the inverting input (—) of the differential amplifier 11 there is a differential voltage from the voltage $U_{GK}$ and the negative threshold voltage value $U_{GKS}$. As long as the voltage $U_{GK}$ is more positive than the negative threshold voltage value $U_{GKS}$, the differential voltage between the inputs of the differential aplifier 11 is positive so that the switching transistor 20 is set into a power-conducting state and voltage potential is connected through the status signal output 23 of the threshold voltage comparator 9, which corresponds to the negative voltage potential at the voltage terminal U— of the voltage supply unit.

If, due to a logic command OFF, the first controllable switching unit 5 is reset into a power-blocking state and the second controllable switching unit 6 becomes power-conductive, then a negative gate current $i_G$ flows from the negative voltage terminal U— into the gate terminal G of the turn-off thyristor 1, whereupon the latter after a storage time $t_S$ goes over into a current-blocking state (see FIG. 1). As soon as the voltage $U_{GK}$ drops below the preset negative threshold voltage value $U_{GKS}$, the differential voltage between the non-inverting input (+) and the inverting input (—) of the differential amplifier 11 becomes negative so that the switching transistor 20 is reset into a current-blocking state; the result is a current flow restricted by the collector resistance 21 through diode 22 so that the status signal output 23 of the threshold voltage comparator 9 assumes approximately the zero voltage potential value of the chassis ground terminal. This voltage state at the status signal output 23 of threshold voltage comparator 9 corresponds with a status signal Z indicating the current-blocking state of turn-off thyristor 1.

Figure 3:
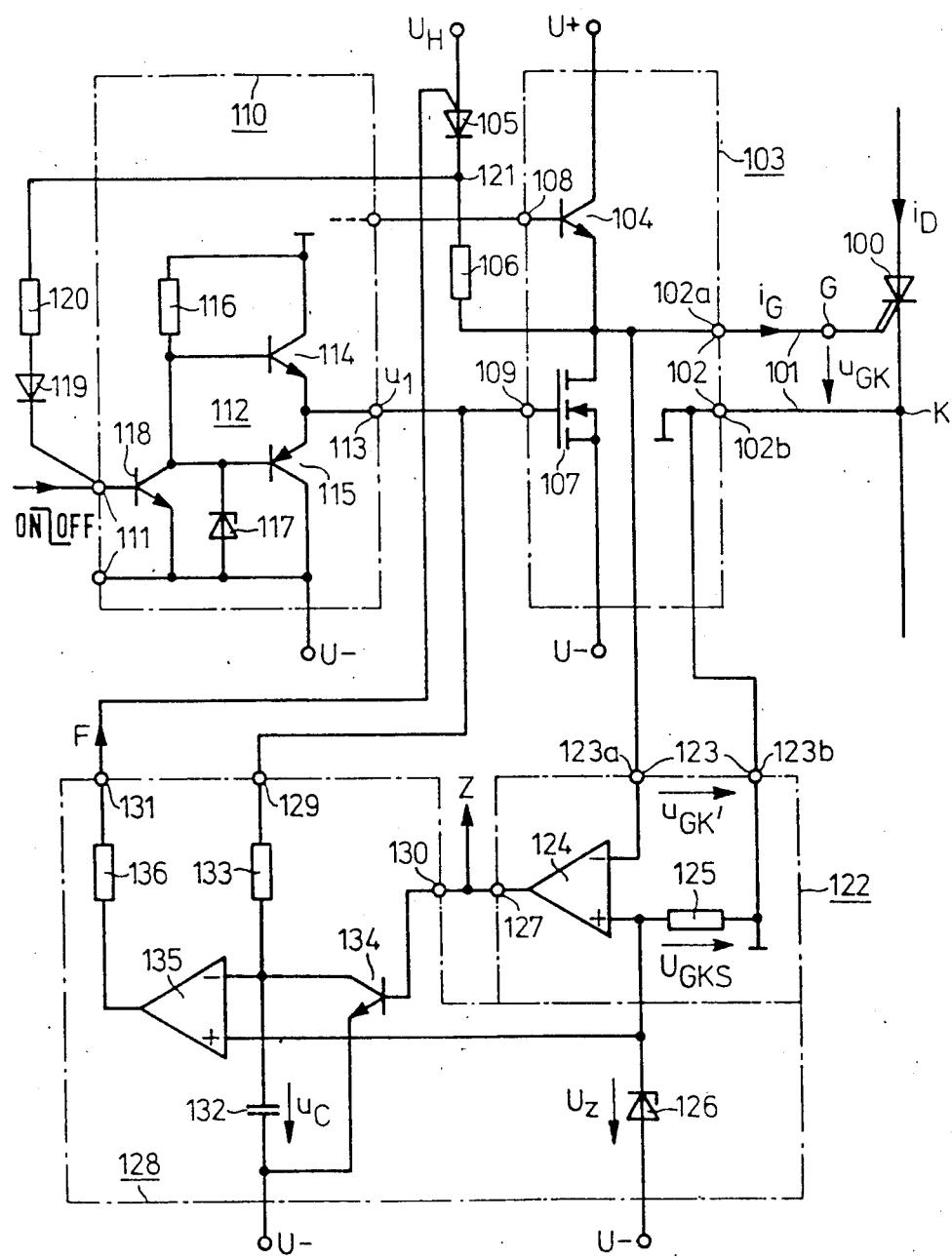
FIG. 3 is a schematic of another preferred embodiment of the device in accordance with the invention.

FIG. 3 shows a further preferred embodiment of the device in accordance with the invention with a turn-off thyristor 100 through which a conductive-state current $i_D$ is flowing. The turn-off thyristor 100 is connected with its gate terminal G and its cathode terminal K over a control line 101 to a control output 102 of a control generator 103. Said unit incorporates in the same way as in the embodiment according to FIG. 2 a first controllable switching unit 104 consisting of a transistor which connects the control output terminal 102a of control output 102, which is connected to gate terminal G, with a positive voltage terminal U+ carrying positive voltage potential of a voltage supply unit which is not further shown here. A series circuit of an additional controllable switching unit 105 consisting of an anode side triggerable auxiliary thyristor and a current-limiting resistance 106 connects the control output terminal 102a with a positive auxiliary voltage terminal $U_H$, which preferably has a higher positive voltage potential than the positive voltage terminal U+. A further controllable switching unit 107, consisting of an MOS field effect transistor, connects the control output terminal 102a with a negative voltage terminal U− of the voltage supply unit having negative voltage potential. The control output terminal 102b connected to the cathode connection of the turn-off thyristor 100 is connected with a chassis ground terminal having zero potential so that the control generator 103 has the same cathode potential as the turn-off thyristor 100. Both controllable switching units 104 and 107 are connected with their control inputs 108 or 109 to a driver stage 110 which is triggered at a control input 111 to set the turn-off thyristor 100 into a power-conductive or power-blocking state by a logic command ON or a logic command OFF. The circuitry of driver state 110 is shown in FIG. 3 only in part as needed to regulate the additional controllable switching unit 107. For that purpose, driver stage 110 has a complementary emitter follower stage 112, whose output 113 is connected to the control input 109 of additional controllable switching unit 107. The complementary emitter follower stage 112 incorporate two mutually complementary transistors 114 and 115, which with their corresponding collector-emitter sections are wired in series between the chassis ground terminal and the negative voltage terminal U−. In a parallel circuit to transistors 114 and 115 there is a series resistance 116 and a breakdown diode 117 connected in series, with the connection point of the series resistance 116 and of the breakdown diode 117 connected to the base terminals of both transistors 114 and 115. A switching transistor 118 is wired in parallel to the breakdown diode 117 with its collector-emitter section, whose base terminal and emitter terminal are connected to the control input 111 of driver stage 100. The base terminal of switching transistor 118 is further connected via a decoupling diode 119 and a resistance 120 to the common switching point 121 of additional controllable switching unit 105 and current-limiting resistance 106.

A threshold voltage comparator 122 is also connected to turn-off thyristor 100. Its input 123 is connected via a first input terminal 123a to the gate terminal G and via a second input terminal 123b to the cathode terminal K of turn-off thyristor 100. In the embodiment of the device according to the invention shown in FIG. 3, input 123 of threshold voltage comparator 122 is directly connected to the control output 102 of control source 103 so that a separate measurement line from the threshold voltage comparator 122 to the turn-off thyristor 100 is not required. The threshold voltage comparator 122 incorporates a differential amplifier 124 functioning as a zero voltage comparator with a non-inverting input (+) and an inverting input (−). The inverting input (−) is connected directly to the input terminal 123a, and the non-inverted input (+) is connected by a reference voltage element 125 to the input terminal 123b of the threshold voltage comparator 122. The reference voltage element 125 consists in the embodiment shown of a resistance connected at its connection point to the non-inverting input (+) of the differential amplifier 124 by a breakdown diode 126 with the negative voltage terminal U− of the voltage supply unit so that at the resistance a voltage drop arises, which corresponds to the voltage difference between the negative voltage potential of voltage terminal U− and the diode voltage $U_Z$ of breakdown diode 126; by this voltage drop a negative threshold voltage value $U_{GKS}$ of the threshold voltage comparator 122 is determined. The output of the differential amplifier 124 generates a status signal output 127 of the threshold voltage comparator 122 to issue a status signal Z. A time limiter 128 is connected to the threshold voltage comparator 122 to generate a time cycle. The time limiter has a start input 129, an interrupt input 130, and a malfunction notification output 131 to issue a malfunction notification signal F when completing the time cycle. The time limiter 128 is connected with its interrupt input 130 to the status signal output 127 of the threshold voltage comparator 122; its start input 129 is connected to the output 113 of the complementary emitter stage 112 of driver stage 110, and its malfunction notification output 131 is connected to the control terminal of the additional controllable switching unit 105. The time limiter 128 incorporates a series circuit comprising a timing capacitor 132 and a timing resistance 133, which is connected between a start input 129 and the negative voltage terminal U− of the voltage supply unit. a controllable switching element 134 is wired in parallel to the timing capacitor 132, with the switching element consisting of a transistor whose base terminal forms the interrupt input 130 of the time limiter 128. The time limiter 128 further contains a comparative unit 135, which is connected with its first input terminal (−) to the connection point between the timing resistance 133 and the timing capacitor 132 and with its second input terminal (+) to a reference voltage source which consists of a breakdown diode 126. The output of the comparator unit 135 is connected through a resistance 136 to the malfunction notification unit 131 of the time limiter 128.

The functional operation of the embodiment of the device in accordance with the invention shown in FIG. 3 will be described based upon the signals identified in that illustration and the relevant time characteristics shown in FIG. 4. The voltage potentials of the signals shown refer in this context, insofar as they do not involve currents or differential voltages, to the negative voltage potential at the negative voltage terminal U− of the power supply unit.

The setting of turn-off thyristor 100 into a power-conducting or power-blocking state is handled by a logic command ON or a logic command OFF at the control input 111 of driver stage 110. Up to the time $t_1$ the control input 111 is triggered by the high level logic command ON so that the voltage signal $U_1$ at the output 113 of the complementary emitter follower stage 112 has the same voltage potential as the negative voltage terminal U−. As a result, the additional controllable switching unit 117 of control source 103 is set into a current-blocking state, and the charging voltage $U_Z$ of timing capacitor 132 in time limiter 128 has zero voltage. The first controllable switching unit 104 is set by the logic command ON in a fashion not further shown here into a current-conducting state so that a slight positive gate current $i_G$ flows from the positive voltage terminal U+ of the voltage supply unit into the gate terminal G of turn-off thyristor 100. Said thyristor is thus in a current-conducting state so that between its gate terminal G and cathode terminal K there is a slight positive voltage $U_{GK}$. The voltage $U_{GK}$ prevailing at input 123 of threshold voltage comparator 122 comprises voltage $U_{GK}$ between the gate terminal G and the cathode terminal K of the turn-off thyristor 100 and the largely inductive voltage drops along control line 101. Between the non-inverting input (+) and the inverting input (−) of the differential amplifier 124 a voltage difference develops from voltage $U_{GK'}$ and the negative threshold voltage $U_{GKS}$. As long as the voltage $U_{GK'}$, is greater than the negative threshold value $U_{GKS}$, said voltage differential is less than zero so that the differential amplifier 124 generates at the status signal output 127 a potential corresponding to the negative voltage potential at the negative voltage terminal U−. Consequently, the controllable switching element 124 of time limiter 128 is set by the interrupt input 130 into a non-conductive state.

At time $t_1$ control input 111 of driver stage 110 is triggered by a logic command OFF with a low voltage level so that the voltage signal $U_1$ at output 113 of the complementary emitter-follower stage 112 assumes the value of the voltage potential at the chassis ground terminal. The timing capacitor 132 is charged by the voltage signal $U_1$ through timing resistance 133 so that the charging voltage $U_C$ rises in accordance with the time constant set by the value of timing resistance 133 and the capacitance of timing capacitor 132. The time constant is rated so that the charging voltage $U_C$ after a preset time cycle $t_{Smax}$ attains a value corresponding to the breakdown voltage $U_Z$ of breakdown diode 126, wherein the time cycle $t_{Smax}$ corresponds to the maximum permissible storage time of turn-off thyristor 100.

At time $t_1$, furthermore, the first controllable switching unit 104 is set into a current-blocking state, and the second controllable switching unit 107 is set by voltage signal $U_1$ into a current-conducting state so that a negative gate current $i_G$ flows from the negative voltage terminal U− into gate terminal G of the turn-off thyristor 100. After a storage time $t_S$ the turn-off thyristor 100 passes into a current-blocking state, and the voltage $U_{GK}$ drops down to a negative voltage value. As soon as the voltage $U_{GK'}$ drops below the preset negative threshold voltage value $U_{GKS}$ at the input of the threshold voltage comparator 122, the voltage differential between the non-inverting input (+) and the inverted input (−) of the differential amplifier 124 drops below zero so that it generates a status signal Z which indicates the current-blocking state of turn-off thyristor 100 at the status signal output 127. The controllable switching element 134 of time limiter 128 is set by the status signal Z in a current-conducting state and interrupts the time cycle by short-circuiting the timing capacitor 132. If the storage time $t_S$ of turn-off thyristor 100 is less than the maximum permissible storage time $t_{Smax}$ corresponding to the preset time cycle, then said interruption takes place before completion of the time cycle.

Figure 4:
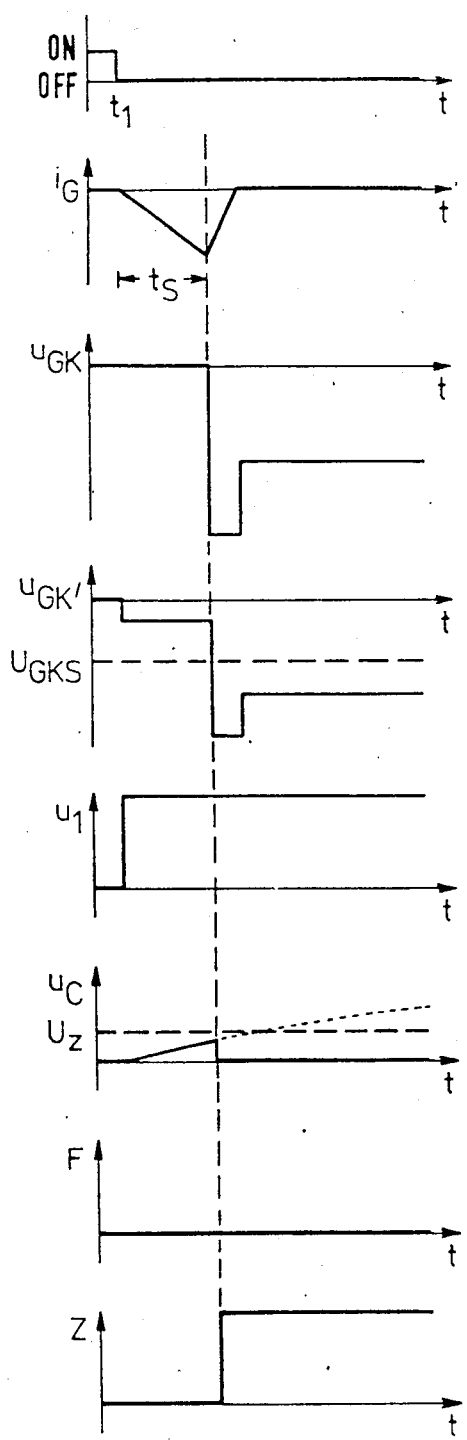
FIGS. 4 and 5 are graphic representations of the current and voltage characteristics respectively as identified in FIG. 4.
Figure 5:
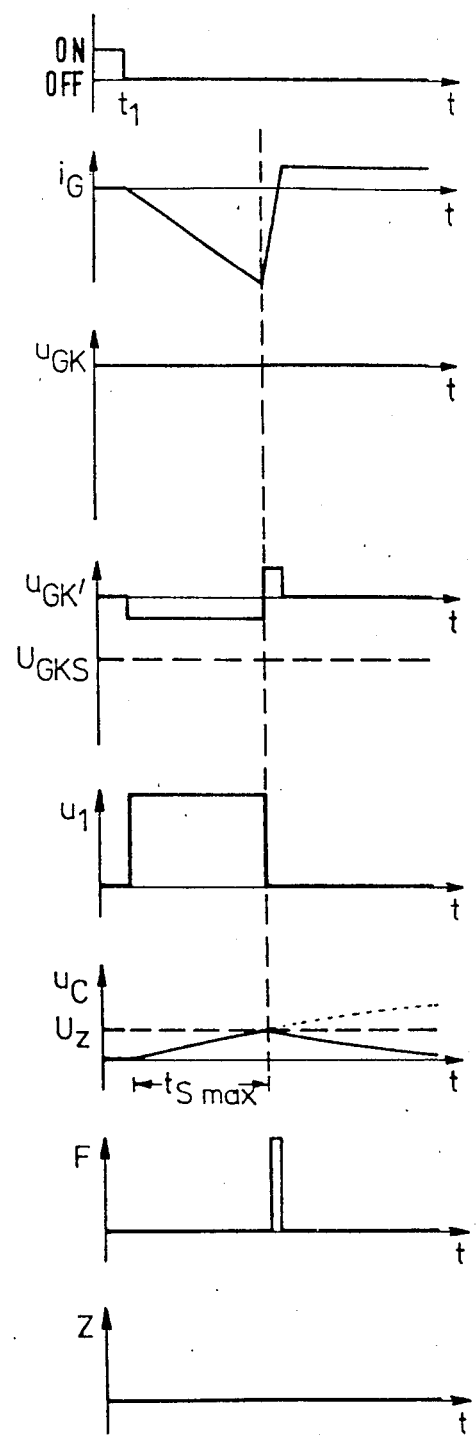

In FIG. 5 the time characteristics of the same signals as shown in FIG. 4 are displayed in a situation wherein the storage time $t_S$ exceeds the maximum permissible storage time $t_{Smax}$ during the switch-off of turn-off thyristor 100. In this case the time limiter 128 generates at its malfunction notification output 131 the malfunction signal F which ignites thyristor 105. The now current-conducting thyristor 105 feeds a logic command OFF to the control input 111 of driver stage 110 through resistance 120 and decoupling diode 119 in a substitute fashion so that the second controllable switching unit 107 is set into a current-blocking state. At the same time a protective ignition of turn-off thyristor 100 takes place by having a positive gate current $i_G$ conducted to the gate terminal G of the turn-off thyristor by thyristor 105.

Figure 6:
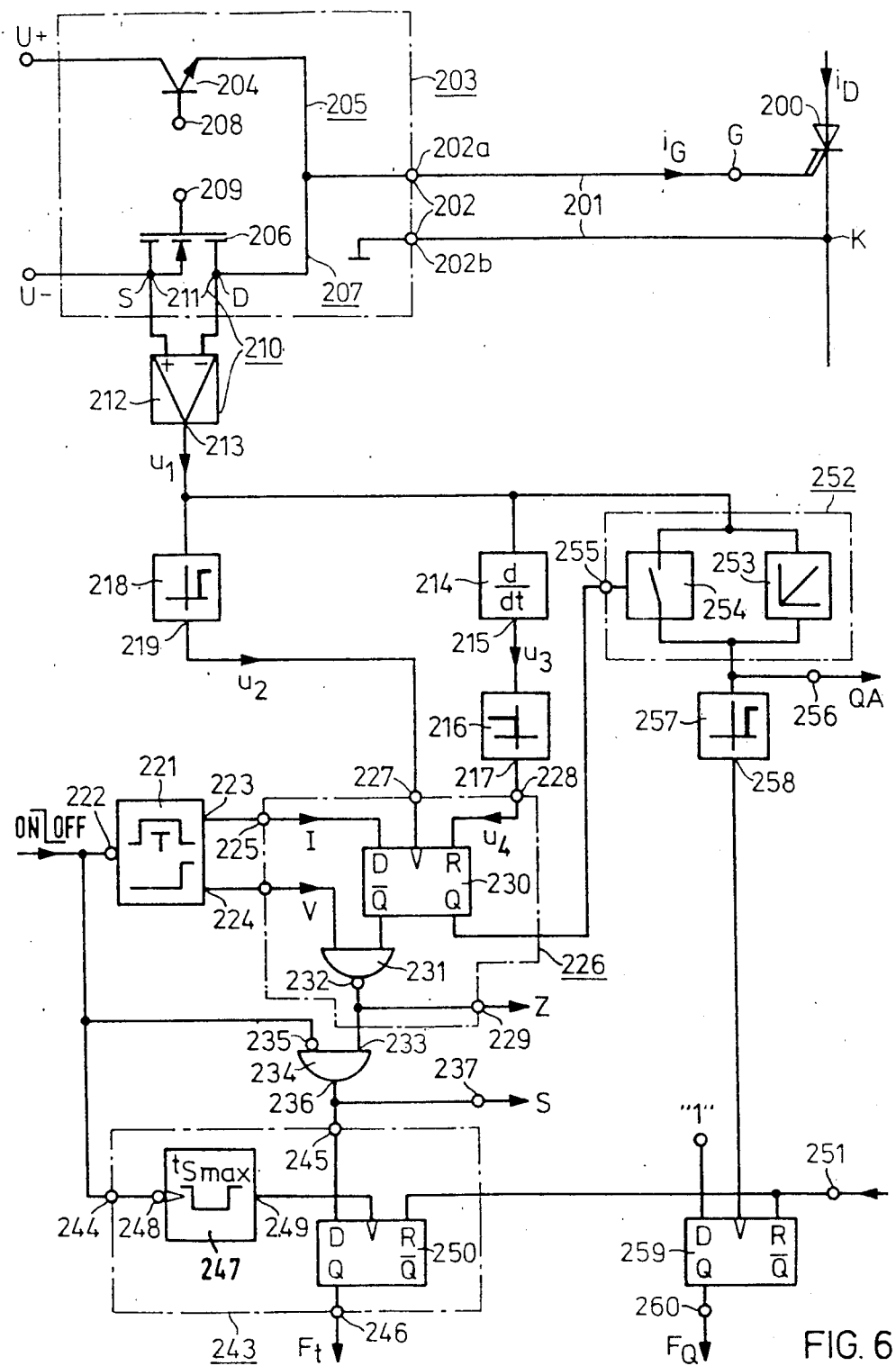
FIG. 6 shows a block diagram of a further embodiment of the device.

FIG. 6 shows a further preferred embodiment of the device in accordance with the invention having a turn-off thyristor 200, which is connected by its gate terminal G and its cathode terminal K over a two-wire control line 201 to a control output 202 of a control source 203 in order to switch a conductive current $i_D$ on and off. The thyristor incorporates again a first controllable switching unit 204 consisting of a bipolar transistor, which is located in a switch on power circuit 205 between a terminal U+ having positive voltage potential of a here not shown voltage supply unit and terminal 202a of the control output 202 connected to gate terminal G. A second controllable switching unit 206, consisting of a field-effect transistor, is wired in a switch-off power circuit 207 between a terminal U− of the voltage supply unit having negative voltage potential and terminal 202a of control output 202. Terminal 202b of control output 202, which is connected to the cathode terminal K of turn-off thyristor 200, is connected to a chassis ground terminal, which in contrast to terminal U+ and U− has zero potential. Both controllable switching units 204 and 206 are connected with their control inputs 208 and 209 to a not further shown control unit to control the turn-off thyristor 200 as a function of a logic command ON or a logic command OFF.

A current detecting unit 210 with a current-sensitive input 211 is wired in turn-off power circuit 207. In the embodiment shown here the field effect transistor which forms the additional controllable switching unit 206 is a component of the current-detecting unit 210, with the drain terminal D and sorce terminal S of the FET forming the current-sensitive input 211 of current detecting unit 210. This embodiment further incorporates a voltage detection unit 212, which forms a here not further shown voltage amplification stage and which is connected on its input side to the current-sensitive input 211 to detect the voltage drop at the FET.

At output 213 of current-detecting unit 210 a differential circuit 214 is connected, which in the simplest case consists of an RC high-pass filter. A polarity detector 216 with an output 217 is connected to output 215 of the differential circuit 214. At the output 213 of the current-detecting unit 210, moreover, a threshold value comparator 218 is connected which has an output 219.

This preferred embodiment of the device in accordance with the invention incorporates a time function element 221, which when triggering its input 222 issues a pulse signal I at an output 223 of a preset time duration T and at further output 224 generates a delay signal V with a delay corresponding with a time duration T. The time function element 221 incorporates for that purpose a here not shown monostable trigger circuit (one shot). The input 222 of time function element 221 is triggered by logic command ON or logic command OFF from the not shown contol unit to control turn-off thyristor 200, wherein logic command ON corresponds to a high-level voltage state and logic command OFF to a low-level voltage state at input 222 of time function element 221.

The time function element 221 is negative-slope-controlled so that time function element 221 is triggered by transitioning from the high-level logic command ON to the low-level logic command OFF. The output 223 of time function element 221 is connected to a first control input 225 of a controllable memory unit 226; a second control input 227 is connected to the output 219 of threshold value comparator 218, and a third control input 228 of the controllable memory unit 226 is connected to the output 217 of polarity detector 216. The controllable memory unit 226 is connected on its output side to a status signal output 229 of the device in accordance with the invention to issue a status signal Z. In the controllable memory unit 226 there is a delay flip-flop 230 whose data input D forms the first control input 225, whose clock input forms the second control input 227 and whose reset input R is the third control input 228 of memory unit 226. The further output 224 of time function element 221 as well as the complementary output, NOT-Q, of delay flip-flop 230 is connected in series with a NAND circuit 231 whose output 232 is connected to the status signal output 229 of the device in accordance with the invention.

Output 232 of NAND circuit 231 is connected to a non-inverting input 233 of an AND circuit 234, which moreover, has an inverted input 235 triggered by the logic command ON or the logic command OFF. Output 236 of the AND circuit 234 is connected by a feedback output 237 of the device according to the invention to issue a feedback signal S having a pulse length corresponding to the storage time $t_S$ of turn-off thyristor 200.

The device in accordance with the invention shown in FIG. 6 contains, moreover, a time limiter 243 to generate a time cycle with a start input 244, which is triggered by the logic command ON or logic command OFF, with an interrupt input 245 which is connected to output 236 of the AND circuit 234, and with a malfunction output 246 to issue a malfunction signal F when concluding the time cycle. The time limiter 243 incudes a one shot 247, which when triggering its trigger input 248 issues at its output 249 a pulse signal with a pulse length corresponding to a preset time cycle $t_{Smax}$ of time limiter 243. The trigger input 248 of one shot 247 forms the start input 244 of time limiter 243, wherein one shot 247 is negative-slope-controlled so that the time cycle when changing from the high level logic command ON to the low-level, logic command OFF is initiated. Output 249 of one shot 247 is connected to the clock input of an additional delay flip-flop 250 whose data input D forms the interrupt input 245 of time limiter 243 and whose non-inverting output, Q, forms the malfunction output 246. The reset input, R, of delay flip-flop 250 is connected to a reset input 251 of the circuitry in accordance with the invention.

Figure 7:
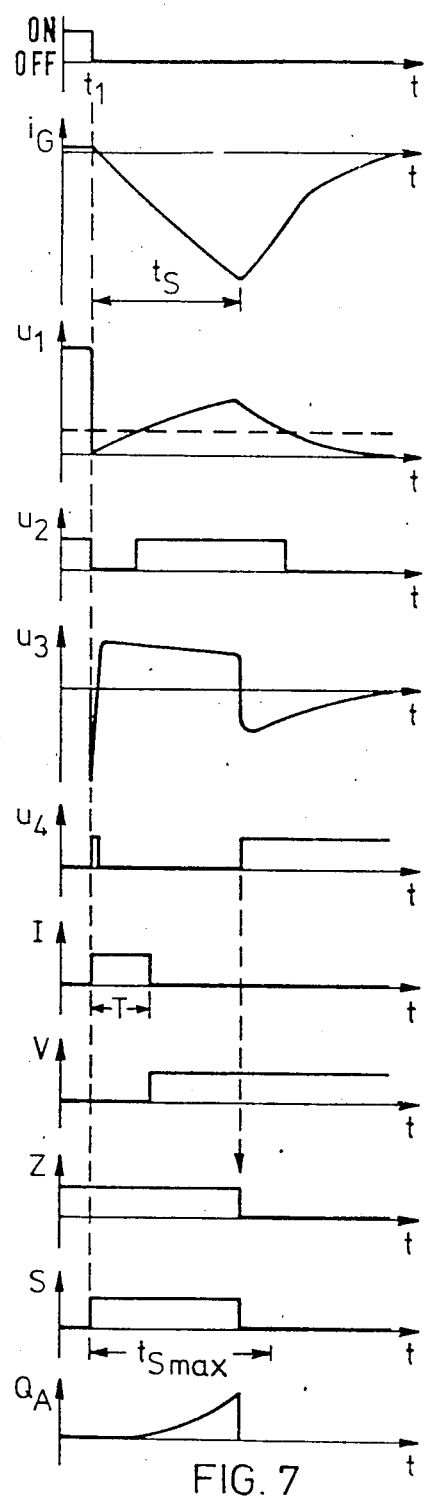
FIGS. 7 and 8 are graphic representations of the current and voltage characteristics respectively as identified in FIG. 6.

An integrating unit 252 is connected to output 213 of current-detecting unit 210. Said unit consists of an integrating device 253 and a controllable switching device 254 wired in parallel to it. The control input of the controllable switching device 254 forms an interrupt input 255 of integrating device 252 and is connected to the non-inverting output, Q, of delay flip-flop 230. The integrating unit 252 on its output side is connected to an additional feedback output 256 of the device in accordance with the invention to issue an additional feedback signal $Q_A$ proportional to the switch-off load of turn-off thyristor 200. A threshold value detector 257 is connected to the output of integrating unit 252 with its output 258 connected to the clock input of an additional delay flip-flop 259. The data input, D, of the additional delay flip-flop 259 is triggered by a high-level voltage status corresponding to a logic state "1;" the non-inverting output, Q, of the additional delay flip-flop 259 is connected with an overload notification output 260 of the device in accordance with the invention to issue an additional overload signal $F_Q$ when exceeding a maximum permissible switch-off load of turn-off thyristor 200. The reset input, R, of the additional delay flip-flop 259 is connected to the reset input 251 of the device in accordance with the invention. The functioning of the embodiment of the device in accordance with the invention shown in FIG. 6 will be described below using the signals identified therein and their respective time characteristics shown in FIGS. 7 and 8.

The first controllable switching unit 204 is set in a current-conductive state up to time point $t_1$ due to a logic command ON so that a positive gate current $i_G$ flows into the gate terminal of turn-off thyristor 200 and said thyristor is thus in a current-conducting state. The FET forming the second controllable switching device 206 is in a current-blocking state so that a voltage corresponding to the voltage difference between the positive voltage terminal U+ and the negative voltage terminal U− is released at its drain source section D-S.

At time $t_1$, due to a logic command OFF, the first controllable switching unit 204 is set into a current-blocking state, and the second controllable switching unit 206 into a current-conducting state. As a result, a negative gate current $i_G$ from the negative voltage terminal U− through the FET which forms the second controllable switching unit 206, into the gate terminal G of turn-off thyristor 200. In the through-connected state the FET behaves nearly as a pure resistance so that a voltage proportional to the negative gate current $i_G$ drops at its drain to source section D-S; said voltage is detected by a voltage detection unit 212 to generate a corresponding output variable $u_1$. In the embodiment shown the voltage detection unit 212 of the current detection unit 210 is connected to the FET in such a fashion that the output variable $u_1$ is positive when the gate current $i_G$ is negative.

The threshold value comparator 218 at output 213 of current detecting unit 212 compares the output variable $u_1$ with a threshold value and generates an output signal $u_2$ which has a positive voltage level, if the negative gate current $i_G$ drops below a negative threshold current value so that the output variable $u_1$ exceeds the threshold value. From the output value $u_1$ of current detecting unit 210, moreover, an auxiliary signal $u_3$ corresponding to the time derivation of output variable $u_1$ is generated in the differential circuit 214. The serially connected polarity detector 216 detects the polarity of the differential signal $u_3$ and generates a polarity signal $u_4$ which has a positive voltage level if the polarity of the auxiliary signal $u_3$ is negative.

When changing from the logic command ON to the logic command OFF at time $t_1$, the time function element 221 is triggered and issues at its output 223 a pulse signal I with a preset time duration T. If within this time duration T the negative gate current $i_G$ drops below the preset negative threshold current value, the delay flip-flop 230 is set. After a storage time $t_S$ starting from time point $t_1$ of the occurrence of logic command OFF, the negative gate current $i_G$ attains its permissible negative value, and the turn-off thyristor 200 passes into a current-blocking state. Thus the polarity signal $u_4$ displays a sign change reflecting the time change of the negative gate current $i_G$ and thereby initiates a resetting of the delay flip-flop 230. by the NAND circuit in the logic of the output state of the delay flip-flop 230 to its inverted output, NOT-Q, with delay signal V at the additional output 224 of time function element 221, a status signal Z is generated, which after concluding the storage time $t_S$ indicates the transition of turn-off thyristor 200 into a current-blocking state by changing from a high to a low voltage level.

Figure 8:
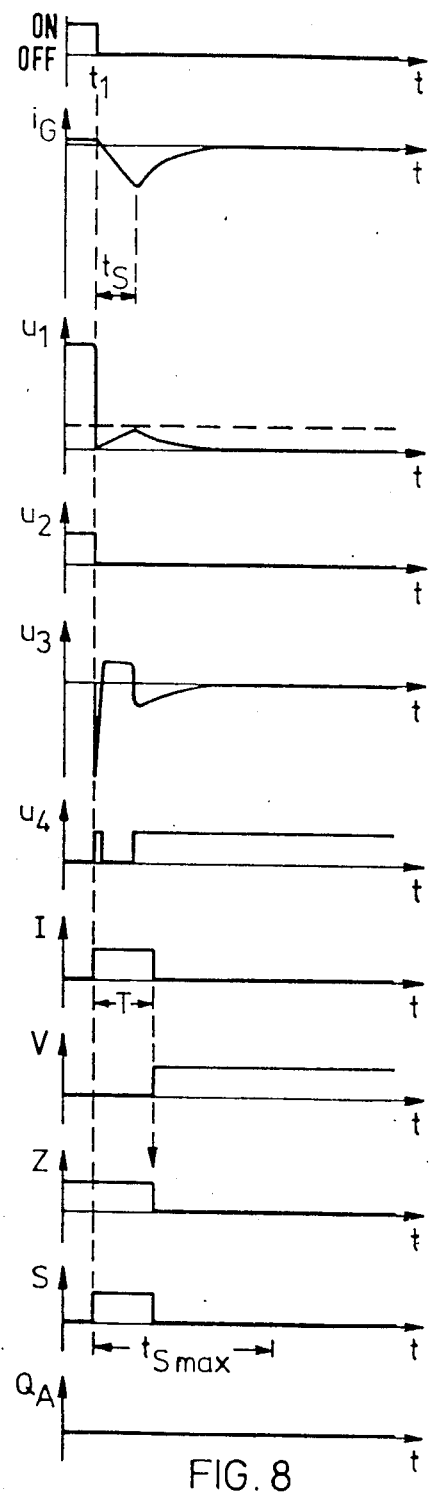

If the negative gate current $i_G$ does not drop below the preset negative threshold current value within the preset time duration T, it can be assumed that turn-off thyristor 200 is operating under zero load or that a very small conductive current $i_D$ was disconnected by turn-off thyristor 200 and it attained its locking state without any noticeable negative gate current $i_G$. In this case current-delay flip-flop 230 remains in a reset condition and a status signal Z is generated as a substitute as soon as the preset time duration T has been completed. This situation is shown in FIG. 8.

By combining status signal Z with the logic command ON in AND circuit 234, feedback signal S is generated, which for the duration of storage time $t_S$ displays a position voltage level. At time $t_1$ a time cycle with a maximum permissible storage time $t_{Smax}$ corresponding to the time cycle of turn-off thyristor 200 is generated. If the storage time $t_S$ of the turn-off thyristor 200 is shorter than the preset time cycle, the time cycle in time limiter 243 is interrupted after completing the feedback signal S. If, on the other hand, storage time $t_S$ exceeds the preset time cycle, then a malfunction signal $F_t$ is generated.

From that point at which the negative gate current $i_G$ drops below the negative threshold current value until completion of the storage time $t_S$ of turn-off thyristor 200, the controllable switching circuit 254 of the controllable integrating unit 252 is set in an opened switching state; integrating circuit 253 forms a further feedback signal $Q_A$ from the output variable $u_1$ proportional to the negative gate current $i_G$, which corresponds to the time interval of output variable $u_1$. After expiration of storage time $t_S$, the value of feedback signal $Q_A$ corresponds to the switch-off load of turn-off thyristor 200 (see FIG. 1). If the value of the additional feedback signal $Q_A$ exceeds a threshold value corresponding to the maximum permissible switch-off load of turn-off thyristor 200, then a further malfunction signal $F_Q$ is generated.

Figure 10:
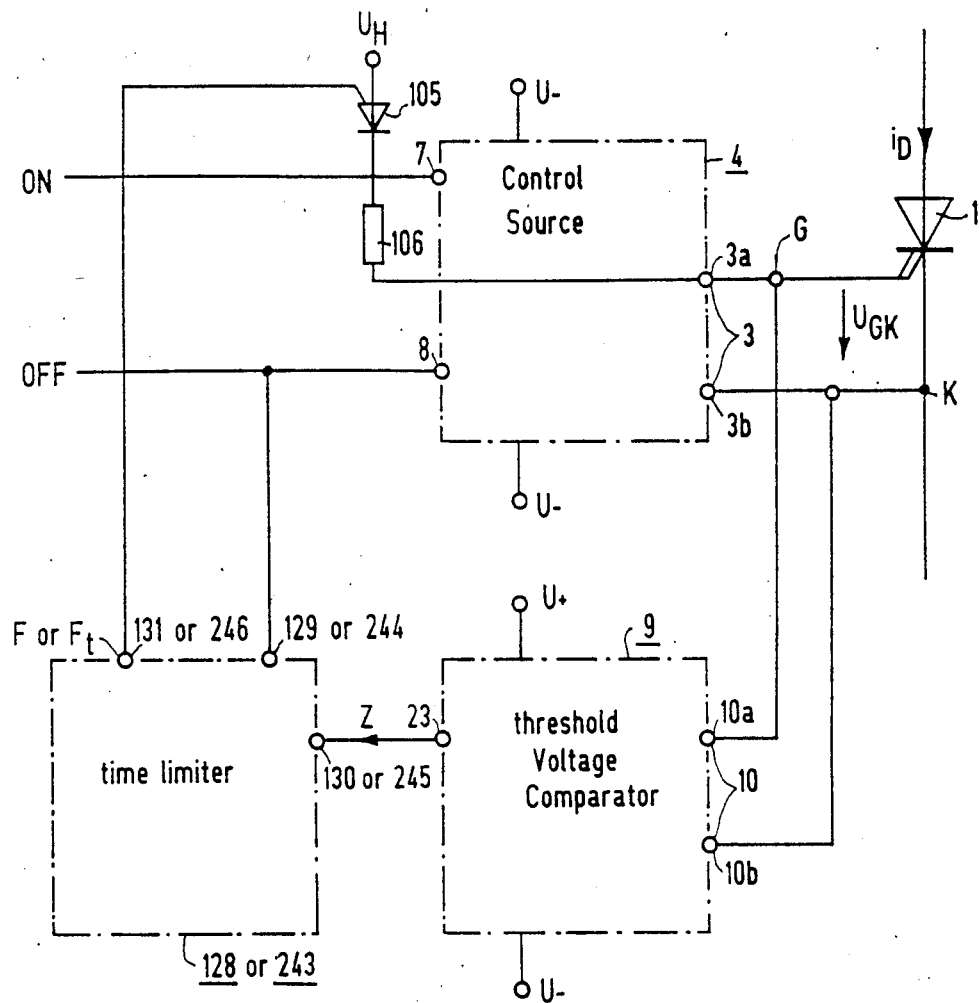
FIG. 10 shows an overall simplified schematic diagram of the device in accordance with the invention.

The elements of the embodiment shown in FIG. 2; with the variable voltage generator 4, the gate control circuit of turn-off thyristor 1, and the threshold voltage comparator 9 for producing the status signal Z; can be supplemented by the previously mentioned time limiter 128 or 243 as shown in FIG. 3 or FIG. 6, respectively, and the additional controllable switching unit 105 as shown in FIG. 3. The embodiment resulting from this combination is depicted by FIG. 10. The device shown in FIG. 10 can effect a protective firing of turn-off thyristor 1 also by means of a circuit measuring the gate-to-cathode voltage, $U_{GK}$, if the status signal Z is not generated within the time allowed for the time limiter. Thus, FIG. 10 gives an overview of embodiment combining elements 4, 9 and either 128 or 243, which are detailed in the other figures.

Figure 9:
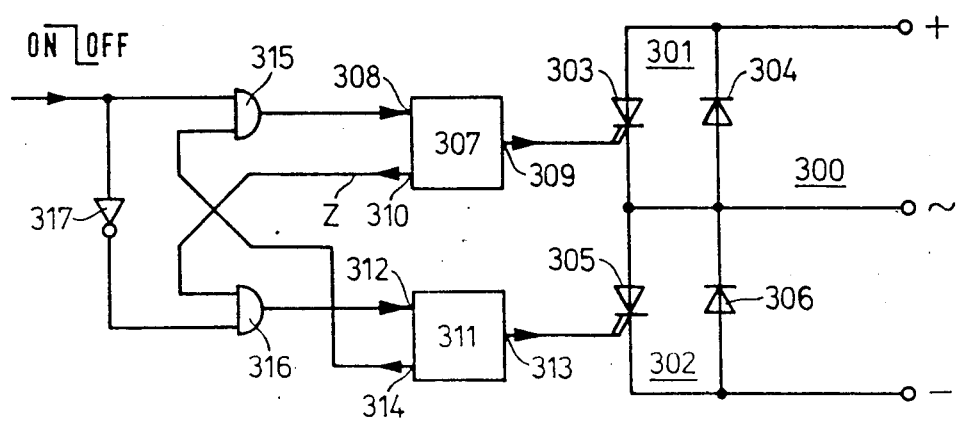
FIG. 9 shows an arrangement of the device in accordance with the invention installed in a converter.

FIG. 9 shows another preferred embodiment of the device in accordance with the invention in a power converter. For simplicity's sake, only one bridge phase 300 of the converter is shown which consists of a first bridge circuit half 301 and a second bridge circuit half 302. In the first bridge circuit half 301 a first turn-off thyristor 303 and an anti-parallel first recovery diode 304 are connected. In the second bridge circuit 302 a second turn-off thyristor 305 and a second anti-parallel recovery diode 306 are located. A first device 307 is connected to the first turn-off thyristor 303, as shown, for example, in FIGS. 2, 3 and 6. The first device 307 incorporates a here not depicted control source with a control input 308 and a control input 309, which in accordance with the triggering of the control input 308 triggers by a logic command ON or a logic command OFF turn-off thyristor 303 having a positive or negative gate current $i_G$. Output 310 of device 307 designates a status signal, at which point a status signal Z is generated if the first turn-off thyristor 303 is in a current-blocking state. A second device 311 is similarly connected to the second turn-off thyristor 305 with a control input 312, a control output 313 and a status signal output 314. The triggering of both turn-off thyristors 303 and 304 is handled by devices 307 or 311 allocated to them as a function of a logic command ON or logic command OFF. For that purpose a first AND circuit 315 is connected to the first device 307, which is triggered at one input by the logic command ON or logic command OFF and at its other input connected to the status signal output 314 of the second device 311. The first AND circuit is on its output side connected to the control input 308 of the first device 307. A second AND circuit 316 is connected to the input of the control input 312 of the second device 311, which similarly is triggered at one input via an integrating circuit 317 with the logic command ON or logic command OFF and connected at its other input to the status signal output 310 of the first device 307. Thus a mutual interlock of both turn-off thyristors 303 and 305 during triggering is assured such that only one of the two turn-off thyristors 303 and 305 is in a current-conducting state at all times, thereby excluding the possibility of a short-circuit within the bridge phase. Said interlock can be attained in a similar fashion in the additional not shown bridge phases of the converter.

It will now be understood that there has been disclosed an improved procedure and device for operating a turn-off thyristor. As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. A device for operating a turn-off thyristor comprising: a threshold voltage comparator circuit having: a first input connected to a gate terminal of the turn-off thyristor at a second input terminal; a negative threshold voltage value reference element connected within the threshold voltage comparator circuit in series with the second input terminal; a status signal output for issuing a status signal when the voltage between the first input and the second input terminal is less than the negative threshold voltage; and a differential amplifier connected within the threshold voltage comparator as a zero voltage comparator having its output connected to the status signal output having a first input connected to the threshold voltage comparator circuit first input, and a second input connected in series with a reference voltage element to the threshold voltage comparator circuit second input in order to generate the negative threshold voltage value.

2. A device according to claim 1, further comprising a time limiter for generating a time cycle having a start input triggered by a switch-off command, an interrupt input connected to the status signal output, and a malfunction notification output for issuing a malfunction signal upon completion of the time cycle.

3. A device according to claim 2, wherein the time limiter includes a series circuit comprising:

a timing capacitor and a timing resistance connected to the start input, and a controllable switching element connected in parallel to the timing capacitor with a control input forming the interrupt input of the time limiter; and a comparator unit connected with its first input connection to the connection point between the timing resistance and the timing capacitor and with its second input terminal to a reference voltage source and the output of the comparator unit provides the malfunction notification output of the time limiter.

4. A device according to claim 2, wherein the time limiter includes a one shot having a triggering input forming the start input, with an output of the one shot connected with the clock input of a delay flip-flop having a data input forming the interrupt input and an output forming the malfunction notification output of the time limiter.

5. A device according to claim 2, wherein the turn-off thyristor with its gate terminal and cathode terminal is wired in a switch-on current circuit, having the gate terminal connected by an additional controllable switching unit to a positive auxiliary voltage terminal, and the control input of the additional controllable switching unit connected with the malfunction notification output.

6. A procedure to operate a turn-off thyristor which can be set to a current conducting state by a logic command ON and set to a current blocking state by a logic command OFF, comprising the steps of:

detecting a gate current flowing into a gate terminal of the gate turn-off thyristor;

generating an auxiliary signal after an occurrence of the logic command OFF corresponding to a time change of the gate current; and generating a status signal indicating the transition of the gate turn-off thyristor into a current blocking state, upon a polarity change of said auxiliary signal.

7. A procedure according to claim 6, further comprising the steps of:

initiating simultaneously with the occurrence of the logic command OFF, a time cycle having a preset expiration time; and generating a malfunction notification signal if the time cycle expires prior to the occurrence of the status signal.

8. A procedure according to claim 7, further comprising the step of setting the turn-off thyristor into a current conducting state when the malfunction notification signal occurs.

9. A procedure according to claim 8, further comprising the steps of:

deriving an integration variable corresponding to an integral with respect to time of the detected gate current, from the occurrence of the logic command OFF until the generation of the status signal; and generating an overload notification signal if the integration variable exceeds a preset threshold value before the occurrence of the status signal.

10. A procedure according to claim 9, further comprising the step of setting the turn-off thyristor into a current conducting state before the occurrence of the overload notification signal.

11. A procedure according to claim 7, further comprising the steps of:

deriving an integration variable corresponding to an integral with respect to time of the detected gate current, from the occurrence of the logic command OFF until the generation of the status signal; and generating an overload notification signal if the integration variable exceeds a preset threshold value before the occurrence of the status signal.

12. A procedure according to claim 11, further comprising the step of setting the turn-off thyristor into a current conducting state before the occurrence of the overload notification signal.

13. A procedure according to claim 6, further comprising the steps of:

deriving an integration variable corresponding to an integral with respect to time of the detected gate current, from the occurrence of the logic command OFF until the generation of the status signal; and generating an overload notification signal if the integration variable exceeds a preset threshold value before the occurrence of the status signal.

14. A procedure according to claim 13, further comprising the step of setting the turn-off thyristor into a current conducting state before the occurrence of the overload notification signal.

15. A procedure to operate a turn-off thyristor settable to a current conducting state by a logic command ON and settable to a current block state by a logic command OFF, comprising the steps of:

detecting a gate current flowing into a gate terminal of the turn-off thyristor;

generating an auxiliary signal upon the occurrence of the logic command OFF corresponding to the time change of the gate current;

monitoring the detected gate current to determine whether it falls below a negative threshold current value; and generating a status signal upon the occurrence of one of the following conditions:

a changing of the auxiliary signal polarity and a finding of the gate current below the negative threshold current value indicating a transition of the gate turn-off thyristor into a current blocking state; and a continuing of the gate current at a level equal to or greater than the negative theshold current value and an expiration of a preset time duration after an appearance of the logic command OFF.

16. A procedure according to claim 15, further comprising the steps of:

initiating simultaneously with the occurrence of the logic command OFF, a time cycle having a preset expiration time; and generating a malfunction notification signal if the time cycle expires prior to the occurrence of the status signal.

17. A procedure according to claim 16, further comprising the step of setting the turn-off thyristor into a current conducting state when the malfunction notification signal occurs.

18. A procedure according to claim 17, further comprising the steps of:

deriving an integration variable corresponding to an integral with respect to time of the detected gate current, from the occurrence of the logic command OFF until the generation of the status signal; and generating an overload notification signal if the integration variable exceeds a preset threshold value before the occurrence of the status signal.

19. A procedure according to claim 18, further comprising the step of setting the turn-off thyristor into a current conducting state before the occurrence of the overload notification signal.

20. A procedure according to claim 16, further comprising the steps of:
deriving an integration variable corresponding to an integral with respect to time of the detected gate current, from the occurrence of the logic command OFF until the generation of the status signal; and
generating an overload notification signal if the integration variable exceeds a preset threshold value before the occurrence of the status signal.

21. A procedure according to claim 20, further comprising the step of settig the turn-off thyristor into a current conducting state before the occurrence of the overload notification signal.

22. A procedure according to claim 15, further comprising the steps of:
deriving an integration variable corresponding to an integral with respect to time of the detected gate current, from the occurrence of the logic command OFF until the generation of the status signal; and
generating an overload notification signal if the integration variable exceeds a preset threshold value before the occurrence of the status signal.

23. A procedure according to claim 22, further comprising the step of setting the turn-off thyristor into a current conducting state before the occurrence of the overload notification signal.

24. A device for operating a turn-off thyristor having a gate terminal and a cathode terminal connected to a switch-off current circuit, comprising:
a current detecting unit as a part of the switch-off current circuit;
a current sensitive input connected to the current detecting unit;
an output of the current detecting unit connected to an input of a differentiating circuit;
an output of the differentiating circuit connected to an input of a polarity detector; and
connecting means for connecting an output of the polarity detector to a status signal output.

25. A device according to claim 24, further comprising:
a controllable switching element as a part of the switch-off current circuit having a field effect transistor as the controllable switching unit, said field effect transistor having a source terminal and a drain terminal together forming the current sensitive input of the current detecting unit at which a voltage detecting unit is connected to detect the voltage drop across the field effect transistor.

26. A device according to claim 25, further comprising:
a threshold value comparator connected at the output of the current-detecting unit;
a time function element which when triggered by the switch-off command issues a pulse signal with a preset time duration at an output of said time function element; and
a controllable memory unit having a first control input connected to the output of the time function element, a second control input connected to the output of the threshold value comparator, and a third control input connected to the output of the polarity detector; said controllable memory unit having one output connected to the status signal output to issue a status signal whereby the controllable memory unit while triggering its first control input through a triggering of a second control input is reset from a first state, in which the controllable memory unit issues the status signal when completing the triggering of its first control input, into a second state, in which the controllable memory unit issues a status signal when triggering the third control input.

27. A device according to claim 26, wherein the controllable memory unit includes a delay flip-flop having a data input as the first control input, a clock input as the second control input and a reset input as the third control input; and wherein the time function element when triggered by the switch-off command issues a delay signal with a delay corresponding to a preset time duration at an additional output, and the additional output of the time function element and the inverting output of the delay flip-flop are connected by a NAND-circuit with the status signal output.

28. A device according to claim 27, further comprising an integrating unit connected to the output of the current detecting unit, having an interrupt input connected with the non-inverting output of the delay flip-flop, and further comprising a threshold value detector connected to an output of the integrating unit, on its output side being connected to an overload notification output, which issues an overload warning signal during an overload condition.

29. A device according to claim 28, further comprising a time limiter for generating a time cycle having a start input triggered by a switch-off command, an interrupt input connected to the status signal output, and a malfunction notification output for issuing a malfunction signal upon completion of the time cycle.

30. A device according to claim 29, wherein the time limiter includes a series circuit comprising:
a timing capacitor and a timing resistance connected to the start input, and a controllable switching element connected in parallel to the timing capacitor with a control input forming the interrupt input of the time limiter;
and a comparator unit connected with its first input connection to the connection point between the timing resistance and the timing capacitor and with its second input terminal to a reference voltage source and the output of the comparator unit provides the malfunction notification output of the time limiter.

31. A device according to claim 29, wherein the time limiter includes a one shot having a triggering input forming the start input, with an output of the one shot connected with the clock input of a delay flip-flop having a data input forming the interrupt input and an output forming the malfunction notification output of the time limiter.

32. A device according to claim 29, wherein the turn-off thyristor, with its gate terminal and cathode terminal, is wired in a switch-on current circuit, having the gate terminal connected by an additional controllable switching unit to a positive auxiliary voltage terminal, and the control input of the additional controllable switching unit connected with the malfunction notification output.

33. A device according to claim 32, wherein the overload notification output is connected with the control input of the additional controllable switching unit.

34. A device according to claim 27, further comprising a time limiter for generating a time cycle having a start input triggered by a switch-off command, an interrupt input connected to the status signal output, and a malfunction notification output for issuing a malfunction signal upon completion of the time cycle.

35. A device according to claim 34, wherein the time limiter includes a series circuit comprising:
- a timing capacitor and a timing resistance connected to the start input, and a controllable switching element connected in parallel to the timing capacitor with a control input forming the interrupt input of the time limiter; and
- a comparator unit connected with its first input connection to the connection point between the timing resistance and the timing capacitor and with its second input terminal to a reference voltage source and the output of the comparator unit provides the malfunction notification output of the time limiter.

36. A device according to claim 35, wherein the time limiter includes a one shot having a triggering input forming the start input, with an output of the one shot connected with the clock input of a delay flip-flop having a data input forming the interrupt input and an output forming the malfunction notification output of the time limiter.

37. A device according to claim 34, wherein the turn-off thyristor with its gate terminal and cathode terminal is wired in a switch-on current circuit, having the gate terminal connected by an additional controllable switching unit to a positive auxiliary voltage terminal, and the control input of the additional controllable switching unit connected with the malfunction notification output.

38. A device according to claim 26, further comprising an integrating unit connected to the output of the current detecting unit, having an interrupt input connected with the non-inverting output of the delay flip-flop, and further comprising a threshold value detector connected to an output of the integrating unit, on its output side being connected to an overload notification output, which issues an overload warning signal during an overload condition.

39. A device according to claim 38, further comprising a time limiter for generating a time cycle having a start input triggered by a switch-off command, an interrupt input connected to the status signal output, and a malfunction notification output for issuing a malfunction signal upon completion of the time cycle.

40. A device according to claim 39, wherein the time limiter includes a series circuit comprising:
- a timing capacitor and a timing resistance connected to the start input, and a controllable switching element connected in parallel to the timing capacitor with a control input forming the interrupt input of the time limiter element; and
- a comparator unit connected with its first input connection to the connection point between the timing resistance and the timing capacitor and with its second input terminal to a reference voltage source and the output of the comparator unit provides the malfunction notification output of the time limiter.

41. A device according to claim 39, wherein the time limiter includes a one shot having a triggering input forming the start input, with an output of the one shot connected with the clock input of a delay flip-flop having a data input forming the interrupt input and an output forming the malfunction notification output of the time limiter.

42. A device according to claim 39, wherein the turn-off thyristor, with its gate terminal and cathode terminal, is wired in a switch-on current circuit, having the gate terminal connected by an additional controllable switching unit to a positive auxiliary voltage terminal, and the control input of the additional controllable switching unit connected with the malfunction notification output.

43. A device according to claim 42, wherein the overload notification output is connected with the control input of the additional controllable switching unit.

44. A device according to claim 26, further comprising a time limiter for generating a time cycle having a start input triggered by a switch-off command, an interrupt input connected to the status signal output, and a malfunction notification output for issuing a malfunction signal upon completion of the time cycle.

45. A device according to claim 44, wherein the time limiter includes a series circuit comprising:
- a timing capacitor and a timing resistance connected to the start input, and a controllable switching element connected in parallel to the timing capacitor with a control input forming the interrupt input of the time limiter;
- and a comparator unit connected with its first input connection to the connection point between the timing resistance and the timing capacitor and with its second input terminal to a reference voltage source and the output of the comparator unit provides the malfunction notification output of the time limiter.

46. A device according to claim 44, wherein the time limiter includes a one shot having a triggering input forming the start input, with an output of the one shot connected with the clock input of a delay flip-flop having a data input forming the interrupt input and an output forming the malfunction notification output of the time limiter.

47. A device according to claim 44, wherein the turn-off thyristor, with its gate terminal and cathode terminal, is wired in a switch-on current circuit, having the gate terminal connected by an additional controllable switching unit to a positive auxiliary voltage terminal, and the control input of the additional controllable switching unit connected with the malfunction notification output.

48. A device according to claim 24, further comprising an integrating unit connected to the output of the current detecting unit, having an interrupt input connected with the non-inverting output of the delay flip-flop, and further comprising a threshold value detector connected to an output of the integrating unit, on its output side being connected to an overload notification output, which issues an overload warning signal during an overload condition.

49. A device according to claim 48, further comprising a time limiter for generating a time cycle having a start input triggered by a switch-off command, an interrupt input connected to the status signal output, and a malfunction notification output for issuing a malfunction signal upon completion of the time cycle.

50. A device according to claim 49, wherein the turn-off thyristor, with its gate terminal and cathode terminal, is wired in a switch-on current circuit, having the gate terminal connected by an additional controllable switching unit to a positive auxiliary voltage terminal, and the control input of the additional controllable switching unit connected with the malfunction notification output.

51. A device according to claim 50, wherein the overload notification output is connected with the control input of the additional controllable switching unit.

52. A device according to claim 49, wherein the time limiter includes a one shot having a triggering input forming the start input, with an output of the one shot connected with the clock input of a delay flip-flop having a data input forming the interrupt input and an output forming the malfunction notification output of the time limiter.

53. A device according to claim 49, wherein the time limiter includes a series circuit comprising:
a timing capacitor and a timing resistance connected to the start input, and a controllable switching element connected in parallel to the timing capacitor with a control input forming the interrupt input of the time limiter; and
a comparator unit connected with its first input connection to the connection point between the timing resistance and the timing capacitor and with its second input terminal to a reference voltage source and the output of the comparator unit provides the malfunction notification output of the time limiter.

54. A device according to claim 24, further comprising a time limiter for generating a time cycle having a start input triggered by a switch-off command, an interrupt input connected to the status signal output, and a malfunction notification output for issuing a malfunction signal upon completion of the time cycle.

55. A device according to claim 54, wherein the time limiter includes a series circuit comprising:
a timing capacitor and a timing resistance connected to the start input, and a controllable switching element connected in parallel to the timing capacitor with a control input forming the interrupt input of the time limiter; and
a comparator unit connected with its first upper connection to the connection point between the timing resistance and the timing capacitor and with its second input terminal to a reference voltage source and the output of the comparator unit provides the malfunction notification output of the time limiter.

56. A device according to claim 54, wherein the time limiter includes a one shot having a triggering input forming the start input, with an output of the one shot connected with the clock input of a delay flip-flop having a data input forming the interrupt input and an output forming the malfunction notification output of the time limiter.

57. A device according to claim 54, wherein the turn-off thyristor, with its gate terminal and cathode terminal, is wired in a switch-on current circuit, having the gate terminal connected by an additional controllable switching unit to a positive auxiliary voltage terminal, and the control input of the additional controllable switching unit connected with the malfunction notification output.

58. A procedure for operating a converter having a push-pull bridge circuit with a first turn off thyristor connected in a first part of the bridge and a second turn off thyristor connected in a second part of the bridge, comprising the steps of:
detecting a first gate current of the first turn-off thyristor and generating a first auxiliary signal, after the occurrence of a first logic command OFF, corresponding to the time of change of the first gate current;
generating a first status signal, indicating the transition of the first turn-off thyristor to a current-blocking state on the occurrence of a change in polarity of the first auxiliary signal;
providing a logic command ON to the second turn-off thyristor enabled by the first status signal;
detecting a second gate current at the second turn-off thyristor and generating a second auxiliary signal, after the occurrence of a second logic command OFF, corresponding to the time change of the first gate current;
generating a second status signal, indicating the transition of the second turn-off thyristor to a current blocking state on the occurrence of a change in polarity of the second auxiliary signal; and
providing a logic command ON to the first turn-off thyristor enabled by the second status signal.

* * * * *